United States Patent [19]
Kurafuchi et al.

[11] Patent Number: 5,410,182
[45] Date of Patent: Apr. 25, 1995

[54] HIGH DENSITY SEMICONDUCTOR DEVICE HAVING INCLINED CHIP MOUNTING

[75] Inventors: Kazuhiko Kurafuchi; Katsunori Ochi; Yoshiyuki Ishimaru, all of Itami; Kenji Kimura, Kawanishi, all of Japan

[73] Assignee: Mitsubishi Denki Kabushiki Kaisha, Tokyo, Japan

[21] Appl. No.: 79,737

[22] Filed: Jun. 22, 1993

[30] Foreign Application Priority Data

Jun. 30, 1992 [JP] Japan ................................ 4-173137

[51] Int. Cl.⁶ ................... H01L 23/48; H01L 29/44; H01L 29/52; H01L 29/60
[52] U.S. Cl. ................................ 257/692; 257/776; 257/775
[58] Field of Search ............... 257/666, 668, 676, 692, 257/773, 775, 776, 690

[56] References Cited

U.S. PATENT DOCUMENTS 5,126,823  6/1992  Otsuka et al. ................. 257/666
5,237,205  8/1993  Newman ........................ 257/668

FOREIGN PATENT DOCUMENTS 0294015  3/1988  European Pat. Off. .
0351184  7/1989  European Pat. Off. .
2079182  11/1971  France .
216791   1/1990  Japan .

OTHER PUBLICATIONS

Deutsch et al, "45° Wiring Layers for a Thin Film Module Package", IBM Technical Disclosure Bulletin, vol. 24, No. 1B Jun. 1981, pp. 730-731.

Primary Examiner—Andrew J. James
Assistant Examiner—S. V. Clark
Attorney, Agent, or Firm—Leydig, Voit & Mayer

[57] ABSTRACT

A semiconductor device having a rectangular COB substrate body, a die pad on the surface of the substrate body, a plurality of outer leads at the periphery of the substrate body, a plurality of wiring patterns on the surface of the substrate body connected to corresponding outer leads, a plurality of inner leads on the surface of the substrate body surrounding the die pad, connected to corresponding outer leads by the corresponding wiring patterns, and arranged in a substantially rectangular shape having sides, each respectively forming a predetermined acute angle with respect to a corresponding side of the substrate body whereby intervals between adjacent wiring patterns are longer than a predetermined length, a semiconductor chip having a plurality of electrode pads and mounted on the die pad, and a plurality of wires establishing electrical connections between the plurality of electrode pads of the semiconductor chip and corresponding inner leads.

14 Claims, 4 Drawing Sheets

HIGH DENSITY SEMICONDUCTOR DEVICE HAVING INCLINED CHIP MOUNTING

BACKGROUND OF THE INVENTION

1. Field of the Invention

The present invention relates to a high density semiconductor device having a semiconductor chip mounted thereon. The present invention also relates to a COB (Chip On Board) substrate, a TAB (Tape Automated Bonding) substrate and a lead frame.

2. Description of the Related Art

FIG. 7 is a plan view of a conventional COB substrate. A die pad 1 for mounting a semiconductor chip is formed on a substrate body 5 of a substantially rectangular shape. A plurality of inner leads 2 are disposed around the die pad 1. Further, a plurality of outer leads 4 corresponding to the inner leads 2 are disposed on the edges of a pair of longer sides 5a and 5b of the substrate body 5. The corresponding inner leads 2 and the outer leads 4 are connected to one another by wiring patterns 3 formed of a conductive material, such as copper. The die pad 1 is generally a rectangular shape, the die pad 1 having the sides that are parallel to the sides of the substrate body 5.

The semiconductor chip (omitted from illustration) having a plurality of electrode pads is mounted on the die pad 1 of the foregoing COB substrate, the electrode pads and the inner leads 2 being electrically connected to one another by wires (omitted from illustration). Then, the semiconductor chip, the die pad 1, the inner leads 2 and the wires are sealed with resin or the like as a packaged semiconductor device.

In a case where the plurality of the outer leads 4 are, in an unbalanced manner, disposed along the longer sides 5a and 5b of the substrate body 5 as shown in FIG. 7, portions A and B, in which the wiring patterns 3 for connecting the inner leads 2 and the outer leads 4 to one another undesirably disposed densely. If the interval between the adjacent wiring patterns 3 is shorter than a predetermined value, short circuiting or cross talk reduces reliability. Therefore, the substrate body 5 must have a large width in order to make the intervals between the wiring patterns in the dense portions A and B longer than a predetermined value. As a result, there arises a problem in the foregoing case that the size of the semiconductor device cannot be reduced. In particular, in a case of a microcomputer, for example, where a semiconductor chip of a type having a multiplicity of electrode pads is mounted, the substrate body 5 must have a sufficiently large size.

It might be considered feasible to employ a substrate with a multiplicity of layers connected to one another by through holes in order to prevent the enlargement of the substrate body 5. However, other problems arise in that the thickness of the substrate cannot be reduced and that the structure becomes too complicated.

SUMMARY OF THE INVENTION

An object of the present invention is to provide a compact and reliable semiconductor device capable of overcoming the foregoing problems while raising mounting density.

Another object of the present invention is to provide also a COB substrate, a TAB substrate and a lead frame for forming the foregoing semiconductor device.

A first semiconductor device according to the present invention comprises: a COB substrate body in a substantially rectangular shape; a die pad on the surface of the substrate body; a plurality of outer leads densely and coarsely disposed in the periphery of the substrate body; a plurality of wiring patterns on the surface of the substrate body and connected to first ends of corresponding outer leads; a plurality of inner leads formed on the surface of the substrate body surrounding the die pad and connected to second ends of corresponding wiring patterns, and arranged in a substantially rectangular shape inclined at a predetermined angle with respect to each side of the substrate body to make the intervals between adjacent wiring patterns longer than a predetermined value; a semiconductor chip having a plurality of electrode pads and mounted on the die pad; and a plurality of wires establishing electrical connections between the plurality of the electrode pads of the semiconductor chip and the plurality of the inner leads.

A COB substrate according to the present invention comprises: a substrate body in a substantially rectangular shape; a die pad formed on the surface of the substrate body; a plurality of inner leads formed on the surface of the substrate body surrounding the die pad in a substantially rectangular shape; a plurality of outer leads corresponding to respective inner leads densely and coarsely formed in the periphery of the substrate body; and a plurality of wiring patterns formed on the surface of the substrate body establishing electrical connections between the inner leads and corresponding outer leads, the plurality of the inner leads being arranged in a rectangular shape inclined at a predetermined angle with respect to each side of the substrate body to make the intervals between adjacent wiring patterns longer than a predetermined value.

A second semiconductor device according to the present invention comprises: an insulating film having a rectangular opening; a semiconductor chip positioned in the opening of the insulating film and having a plurality of electrode pads; a plurality of leads disposed on the insulating film and connected to the plurality of the electrode pads of the semiconductor chip at end portions thereof; and a package body in a substantially rectangular shape sealing the semiconductor chip, the insulating film and end portions of the plurality of the leads with other end portions of the plurality of the leads outside the body, the semiconductor chip being inclined at a predetermined angle with respect to each side of the package body to make the intervals between adjacent leads longer than a predetermined value.

A TAB substrate according to the present invention comprises: an insulating film having a rectangular opening for accommodating a semiconductor chip; and a plurality of leads disposed on the insulating film so that end portions of the plurality of the leads face the inside of the opening, a sealed region including the opening of the insulating film and end portions of the plurality of the leads in a substantially rectangular shape, the end portions of the plurality of the leads being disposed in a substantially rectangular shape inclined at a predetermined angle with respect to each side of the sealed region to make the intervals between adjacent leads longer than a predetermined value.

A third semiconductor device according to the present invention comprises: a die pad; a plurality of leads disposed so that end portions of the plurality of the leads surround the die pad; a semiconductor chip having a plurality of electrode pads and mounted on the die pad; a plurality of wires establishing electrical connections between the plurality of the electrode pads of the semiconductor chip and end portions of the plurality of the leads; and a package body into a substantially rectangular shape sealing the semiconductor chip, the insulating film, end portions of the plurality of the leads and with other portions of the plurality of the leads exposed outside the body, the end portions of the plurality of the leads being disposed in a substantially rectangular shape inclined at a predetermined angle with respect to each side of the package body to make the intervals between adjacent leads longer than a predetermined value.

A lead frame according to the present invention comprises: a die pad; and a plurality of leads disposed so that end portions of the plurality of the leads surround the die pad, a sealed region including the die pad and end portions of the plurality of the leads and in a substantially rectangular shape, the end portions of the plurality of the leads being disposed in a substantially rectangular shape inclined at a predetermined angle with respect to each side of the sealed region to make the intervals between adjacent leads longer than a predetermined value.

The first semiconductor device and the COB substrate according to the present invention includes the plurality of the inner leads in a substantially rectangular shape inclined at a predetermined angle with respect to each side of the substrate body so that adjacent wiring patterns are disposed at intervals longer than a predetermined value.

The second semiconductor device or the TAB substrate according to the present invention has the semiconductor chip inclined at a predetermined angle with respect to each side of the package body or end portions of the plurality of the leads are inclined at a predetermined angle with respect to each side of the sealed region so that adjacent leads are disposed at intervals longer than a predetermined value.

The third semiconductor device and the lead frame according to the present invention has end portions of the plurality of the leads inclined at a predetermined angle with respect to each side of the package body or the sealed region so that adjacent leads are disposed at intervals longer than a predetermined value.

DESCRIPTION OF THE PREFERRED EMBODIMENTS

Preferred embodiments of the present invention will now be described with reference to the accompanying drawings.

Figure 1:
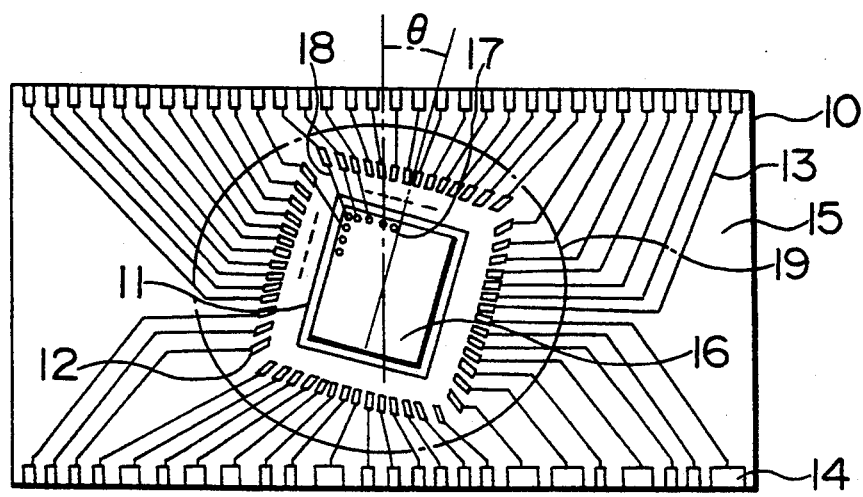
FIG. 1 is a plan view which illustrates a semiconductor device according to a first embodiment of the present invention.
Figure 2:
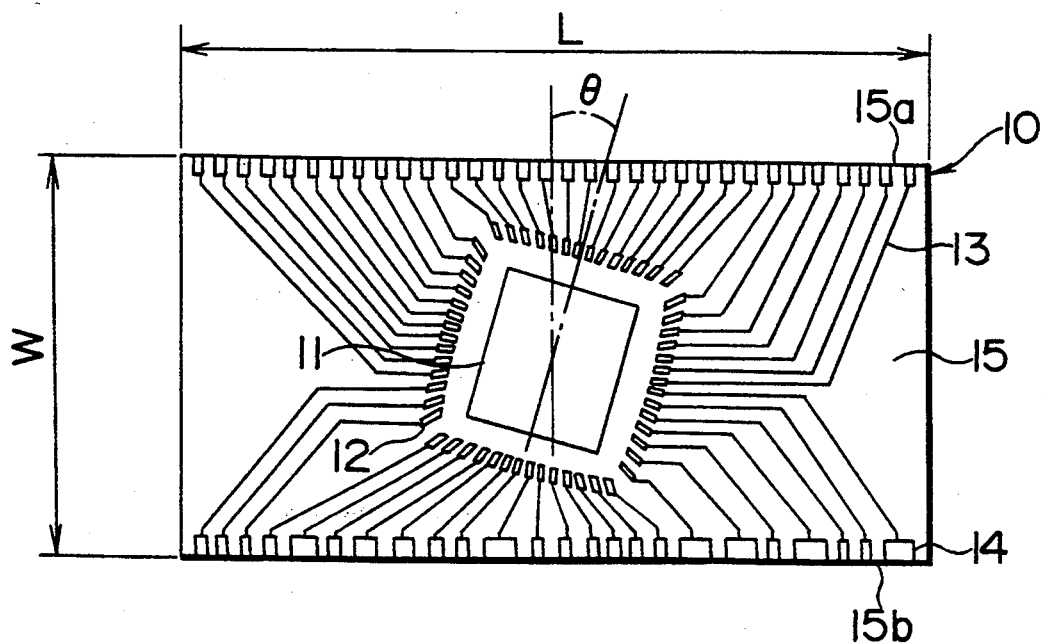
FIG. 2 is a plan view which illustrates a COB substrate for use in the semiconductor device shown in FIG. 1.

Referring to FIG. 1, a semiconductor device according to a first embodiment of the present invention has a COB substrate 10 as shown in FIG. 2. A substrate body 15 made of epoxy glass or the like in a substantially rectangular shape has a rectangular die pad 11 for mounting a semiconductor chip formed thereon. The die pad 11 is disposed so that its sides form an acute angle $\theta$ with corresponding sides of the substrate body 15. A plurality of inner leads 12 are disposed around the die pad 11. That is, the plurality of the inner leads 12 form a rectangular shape that makes the angle $\theta$ with each side of the substrate body 15. Further, a plurality of outer leads 14 corresponding to the foregoing inner leads 2 are disposed on the edges of a pair of longer sides 15a and 15b of the substrate body 15. The corresponding inner leads 12 and the outer leads 14 are connected to one another by wiring pattern including conductors 13 of a conductive material, such as copper. Each of the conductors 13 includes no more than two bends, i.e., corners.

Figure 7:
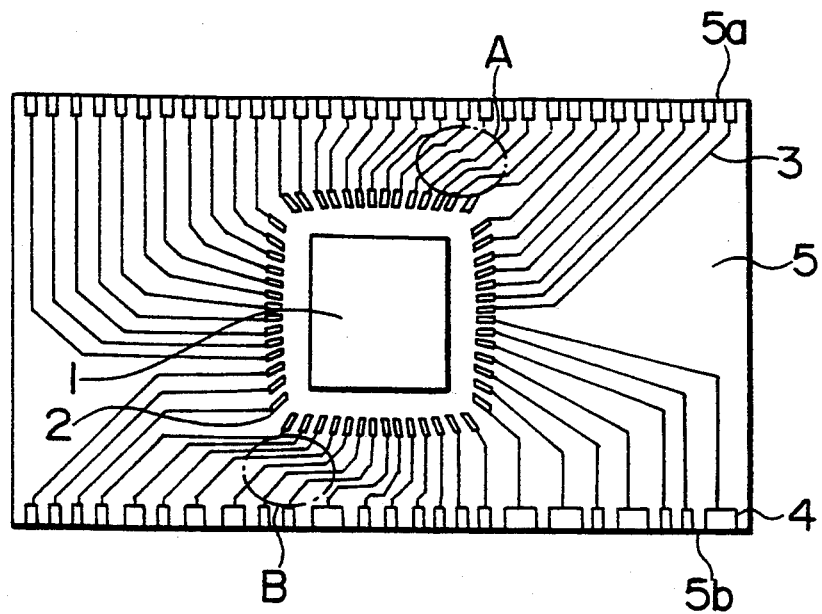
FIG. 7 is a plan view which illustrates a COB substrate for use in a conventional semiconductor device.

Referring to FIG. 2, the length L of the substrate 15, the number of the inner leads 12 and the arrangement of the outer leads 14 respectively are shown to be the same as the length of the substrate body 5, the number of the inner leads 2 and the arrangement of the outer leads 4 of the conventional structure shown in FIG. 7. That of the plurality of the outer leads 14 more are disposed along the longer side 15a than along the longer side 15b of the substrate body 15. If the inner leads 12 are parallel to each side of the substrate body 15 as in the conventional structive portions of the wiring conductors 13 are undesirably densely arranged in the upper right portion and the lower left portion as shown in FIG. 7. The COB substrate 10 according to this embodiment is therefore arranged so that the overall pattern of the inner leads 12 is in a rectangular shape having sides inclined at an acute angle $\theta$ to corresponding sides of the body 15 to enlarge the spacing of the upper right portion and the lover left portion of the substrate body 15 in which the wiring patterns 13 can easily be disposed densely. As a result, the overall width W of the substrate body 15 can be narrowed in comparison to the substrate body 5 shown in FIG. 7 although the adjacent wiring conductors 13 are disposed at satisfactory long intervals of, for example, 100 $\mu$m or longer.

A semiconductor chip 16 is mounted on the die pad 11 of the foregoing COB substrate 10 as shown in FIG. 1. Further, a plurality of electrode pads 17 formed on the surface of the semiconductor chip 16 are electrically connected to the corresponding inner leads 12 via wires 18. FIG. 1 illustrates a portion of the plurality of the electrode pads 17 and wires 18 while omitting the residual portions. Referring to FIG. 1, reference numeral 19 represents a sealed region in which the semiconductor chip 16, the die pad 11, the plurality of the inner leads 12 and the plurality of the wires 18 are sealed with a sealing material such as resin by a potting method or the like. As a result, the semiconductor device is manufactured.

Figure 3:
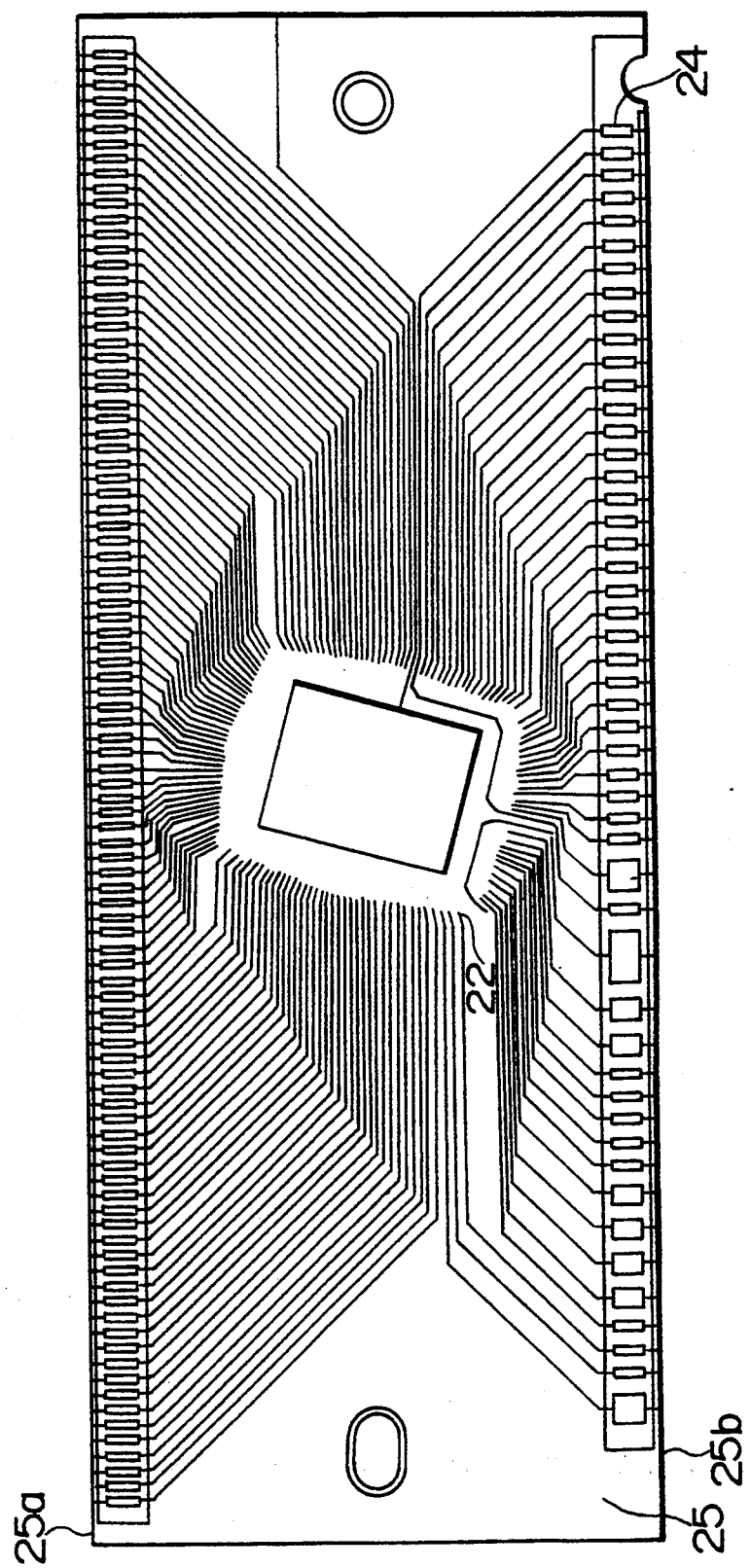
FIG. 3 is a plan view which illustrates a specific example of the COB substrate according to the present invention.

FIG. 3 is a plan view of a COB substrate in accordance with the present invention. The COB substrate is used to mount a microcomputer chip thereon, the COB substrate having 96 outer leads 24 on a longer side 25a of a substrate body 25 and having 50 outer leads 24 on a longer side 25b of the same. By rightwards inclining the inner leads 22 at an angle of 15° at the sides of the substrate body 25, the width of the substrate body 25 can be reduced to 24.0 mm from the 28.0 mm that has been required for the conventional structure.

Figure 4:
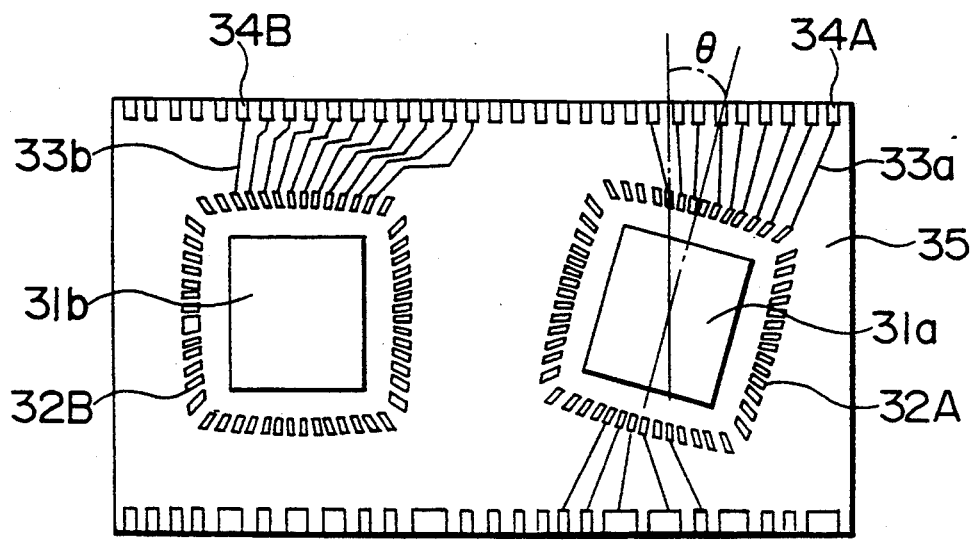
FIG. 4 is a plan view which illustrates a modification of the COB substrate according to the present invention.

It should be noted that a plurality of semiconductor chips can be mounted on one COB substrate. A COB substrate shown in FIG. 4 has first and second die pads 31a and 31b thereon. Further, first and second inner lead groups 32A and 32B are located around the die pads 31a and 31b, the first and second inner lead groups 32A and 32B being arranged in respective rectangular shapes. A substrate body 35 has, in the periphery thereof, first and second outer lead groups 34A and 34B corresponding to the first and second inner lead groups 32A and 32B. Inner leads of the first inner lead group 32A are connected to the outer leads of the corresponding first outer lead group 34A via wiring patterns 33a. Similarly, inner leads of the second inner lead group 32B are connected to outer leads of the second outer lead group 34B via wiring patterns 33b. The first die pad 31a and the first inner lead group 32A are disposed to form an acute angle θ with each side of the substrate body 35. As a result, the first wiring patterns 33a are disposed at intervals longer than a predetermined value.

Therefore, the size of the substrate body 35 can be reduced even if a plurality of semiconductor chips are mounted. Although the COB substrate shown in FIG. 4 has only the first die pad 31a and the first inner lead group 32A corresponding to one of the semiconductor chips inclined relative to the sides of the substrate body 35, both of the die pads 31a and 31b and both of the inner lead groups 32A and 32B corresponding to the two semiconductor chips may be inclined if necessary. Further, three or more semiconductor chips may similarly be mounted on one COB substrate.

Figure 5:
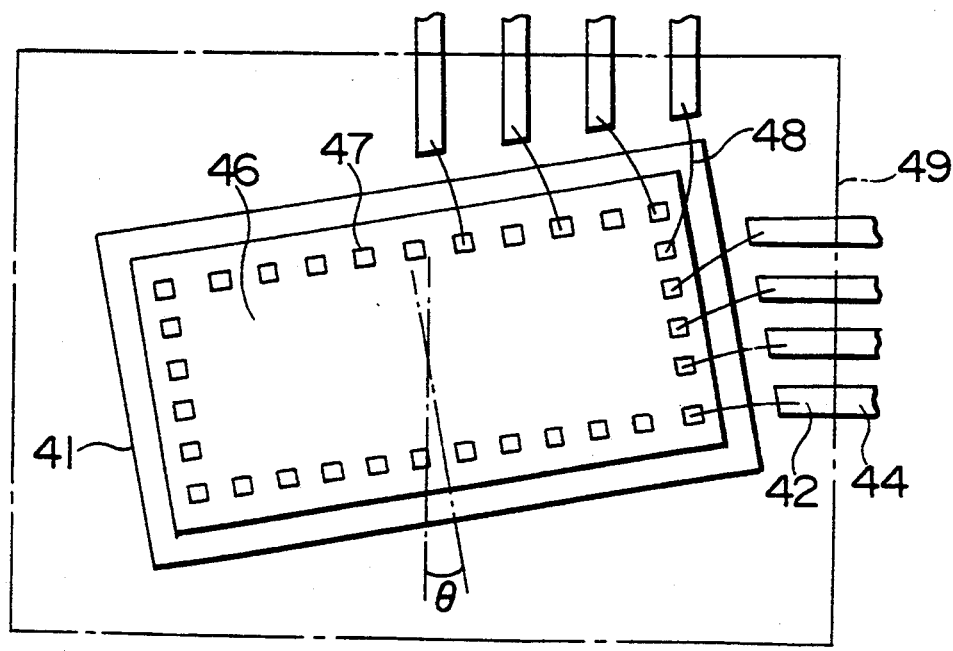
FIG. 5 is a plan view which illustrates a semiconductor device according to a second embodiment.

FIG. 5 illustrates a semiconductor device having a lead frame according to a second embodiment. The lead frame has one die pad 41 and a plurality of inner leads 42 disposed around the die pad 41 in a rectangular arrangement. Outer leads 44 respectively are connected to the inner leads 42. The die pad 41 has a semiconductor chip 46 mounted thereon, the semiconductor chip 46 having a plurality of electrode pads 47. The electrode pads 47 are electrically connected to the corresponding inner leads 42 via wires 48. Referring FIG. 5, reference numeral 49 represents a sealed region in which the semiconductor chip 46, the die pads 47, the plurality of the inner leads 42 and a plurality of wires 48 are sealed with resin or the like so that the outer leads 44 appear outside. As a result, the semiconductor device is manufactured. The lead frame can be formed by etching or punching a metal plate.

In the second embodiment the sides of the die pad 41 form an acute angle θ with each corresponding side of the rectangular sealed region 49, so that the plurality of the inner leads 42 are arranged in a rectangular shape inclined by the angle θ relative to the sides of the sealed region 49. Therefore, a multiplicity of inner leads 42 can be disposed in a small sealed region at intervals longer than a predetermined value. Although the shape and the number of the inner leads 42 are simplified in FIG. 5, a multiplicity of inner leads 42 are actually disposed similarly to the wiring patterns 13 of the semiconductor device shown in FIG. 5.

A ceramic-package-type semiconductor device can be formed similarly. That is, multi-layer wired ceramic and metal material are sintered to form a package, and then a die pad, a plurality of inner leads and a plurality of outer leads are formed as shown in FIG. 5, followed by mounting a semiconductor chip. A plurality of inner leads are disposed in a rectangular shape that has sides inclined by a predetermined angle relative to corresponding sides of the outline of the package.

Figure 6:
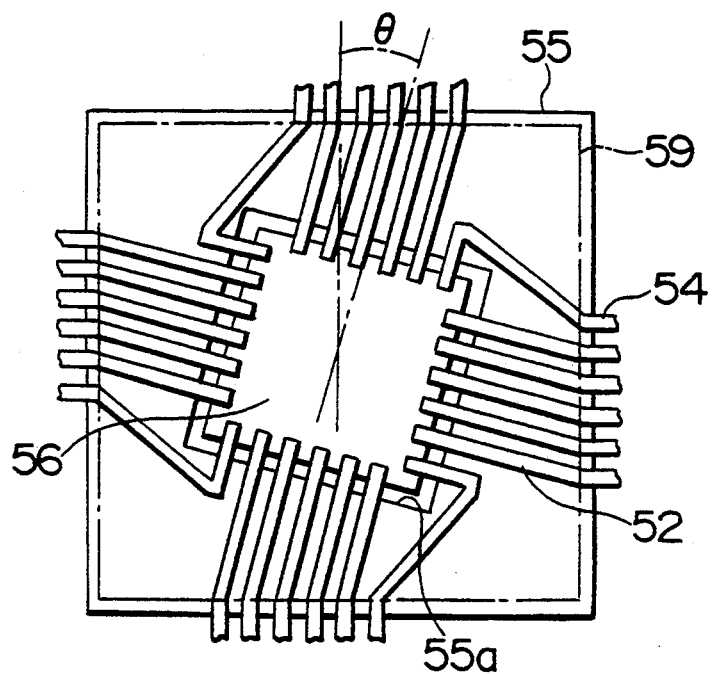
FIG. 6 is a plan view which illustrates a semiconductor device according to a third embodiment.

FIG. 6 illustrates a TCP (Tape Carrier Package)-type semiconductor device using a TAB (Tape Automated Bonding) substrate according to a third embodiment. The TAB substrate has a rectangular insulating film 55, the insulating film 55 having a rectangular opening 55a at the center portion thereof. A plurality of inner leads 52 are disposed on the insulating film 55. Further, an outer lead 54 is integrally connected to each of the inner leads 52. The leading portion of each inner lead 52 is disposed in the opening 55a of the insulating film 55. A semiconductor chip 56 having a plurality of electrode pads is accommodated in the opening 55a of the insulating film 55, the electrode pads being directly connected to the leading portions of the corresponding inner leads 52. Referring to FIG. 6, reference numeral 59 represents a sealed region in which the semiconductor chip 56, the insulating film 55 and the plurality of the inner leads 52 are sealed with resin or the like so that the outer leads 54 appear outside. As a result, the semiconductor device is manufactured.

The third embodiment has the sides of the opening 55a of the insulating film 55 is formed inclined relative to corresponding sides of the rectangular sealed region 59 by acute angle θ, causing the semiconductor chip 56 accommodated in the opening 55a to be disposed in such a manner that its sides are also inclined by the angle θ relative to corresponding package sides. Therefore, a multiplicity of inner leads 52 can be disposed in a small sealed region at intervals longer than a predetermined value. Although the shape and the number of the inner leads 52 are simplified in FIG. 6, a multiplicity of inner leads 52 are actually disposed similarly to the wiring conductors 13 of the semiconductor device shown in FIG. 1.

What is claimed is:

1. A semiconductor device comprising:
a rectangular COB substrate body having a surface and two longer and two shorter sides;
a die pad disposed on the surface of said substrate body;
a plurality of outer leads disposed on the surface of said substrate body along two opposite, longer sides of said substrate body, said plurality of outer leads being of unequal size;
a plurality of inner leads disposed on the surface of said substrate body surrounding said die pad and arranged in a substantially rectangular shape having sides;
a wiring pattern disposed on the surface of said substrate body including a plurality of conductors respectively electrically connecting each of said outer leads with a corresponding inner lead, each side of the rectangular shape forming a predetermined acute angle with respect to a corresponding side of said substrate body, whereby intervals between adjacent conductors of said wiring pattern are longer than a predetermined length;
a semiconductor chip having a plurality of electrode pads mounted on said die pad; and a plurality of wires electrically connecting respective electrode pads of said semiconductor chip and the corresponding inner leads.

2. The device according to claim 1 wherein said die pad is rectangular and has four sides, each side of said die pad forming an acute angle with respect to a corresponding side of said COB substrate body.

3. The device according to claim 1 including a plurality of semiconductor chips and a plurality of inner leads corresponding to said semiconductor chips arranged in substantially rectangular shapes having sides, each side of each rectangular shape being inclined at a predetermined acute angle with respect to a corresponding side of said substrate body, whereby intervals between adjacent wiring patterns are longer than a predetermined length.

4. The device according to claim 1 wherein said substrate body is epoxy glass.

5. A COB substrate comprising:
a rectangular substrate body having a surface and two longer and two shorter sides;
a die pad disposed on the surface of said substrate body;
a plurality of inner leads disposed on the surface of said substrate body surrounding said die pad in a substantially rectangular shape;
a plurality of outer leads corresponding to respective inner leads disposed on two opposite, longer sides of said substrate body, said plurality of outer leads being of unequal size; and
a wiring pattern disposed on the surface of said substrate body including a plurality of conductors respectively establishing electrical connections between each of said inner leads and a corresponding outer lead, said outer leads being arranged in a rectangular shape having sides inclined at a predetermined acute angle with respect to corresponding sides of said substrate body whereby intervals between adjacent conductors of said wiring pattern are longer than a predetermined length.

6. The substrate according to claim 5 wherein said die pad is rectangular and has four sides forming an acute angle with respect to corresponding sides of said substrate body.

7. The substrate according to claim 5 wherein said substrate body is epoxy glass.

8. A semiconductor device comprising:
an insulating film having a rectangular opening;
a rectangular semiconductor chip having four sides, positioned in the opening of said insulating film, and having a plurality of electrode pads;
a plurality of leads disposed on said insulating film and connected to corresponding electrode pads of said semiconductor chip; and
a rectangular package body with four sides sealing said semiconductor chip, said insulating film, and portions of the plurality of said leads with portions of the plurality of said leads outside said package body, each side of said semiconductor chip being inclined at a predetermined angle with respect to a corresponding side of said package body, whereby intervals between adjacent wiring patterns are longer than a predetermined length.

9. The device according to claim 8 wherein each side of the rectangular opening in said insulating film is inclined at a predetermined acute angle with respect to a corresponding side of said package body.

10. The device according to claim 8 including a plurality of rectangular semiconductor chips having sides inclined at a predetermined acute angle with respect to corresponding sides of said package body whereby intervals between adjacent leads are longer than a predetermined length.

11. A TAB substrate comprising:
an insulating film having a rectangular opening for accommodating a semiconductor chip;
a plurality of leads disposed on said insulating film with end portions extending inside the opening; and
a sealed region including the opening of said insulating film and the end portions of the plurality of said leads and having a rectangular shape, said end portions of the plurality of said leads being disposed in a substantially rectangular shape having four sides, each side of the rectangular shape being inclined at a predetermined acute angle with respect to a corresponding side of said sealed region whereby intervals between adjacent leads are longer than a predetermined length.

12. The substrate according to claim 11 wherein the opening in said insulating film has four sides, each side of the opening being respectively inclined at a predetermined acute angle with respect to a corresponding side of said sealed region.

13. The device according to claim 1 wherein each of the conductors connecting respective electrode pads to corresponding inner leads includes no more than two bends.

14. The substrate according to claim 5 wherein each of the conductors connecting respective electrode pads to corresponding inner leads includes no more than two bends.

* * * * *